(12) United States Patent
Maeda (10) Patent No.: US 8,535,546 B2
(45) Date of Patent: Sep. 17, 2013

(54) METHOD OF MANUFACTURING MULTILAYER WIRING SUBSTRATE

(75) Inventor: Shinnosuke Maeda, Nagoya (JP)

(73) Assignee: NGK Spark Plug Co., Ltd., Nagoya (JP)

(*) Notice: Subject to any disclaimer, the term of this patent is extended or adjusted under 35 U.S.C. 154(b) by 36 days.

(21) Appl. No.: 13/312,534

(22) Filed: Dec. 6, 2011

(65) Prior Publication Data

US 2012/0145666 A1    Jun. 14, 2012

(30) Foreign Application Priority Data

Dec. 9, 2010    (JP) .................................. 2010-274542

(51) Int. Cl.
*H01B 13/00*    (2006.01)

(52) U.S. Cl.
USPC .................. 216/13; 216/14; 216/15; 216/16; 216/17; 216/18; 216/19; 216/41; 257/E23.001; 257/E23.006; 257/E23.019; 257/E23.062; 29/830; 29/832; 29/846; 29/852

(58) Field of Classification Search
None
See application file for complete search history.

(56) References Cited

U.S. PATENT DOCUMENTS

| 7,474,538 | B2 | 1/2009 | Kikuchi et al. | |
|---|---|---|---|---|
| 8,015,700 | B2 | 9/2011 | Nakamura et al. | |
| 2002/0108781 | A1* | 8/2002 | Mune et al. | 174/264 |
| 2007/0124924 | A1* | 6/2007 | Nakamura | 29/830 |

FOREIGN PATENT DOCUMENTS

| JP | 09-041161 | * | 2/1997 |
|---|---|---|---|
| JP | 03591524 B2 | | 11/2001 |
| JP | 2007-013092 A | | 1/2007 |

* cited by examiner

*Primary Examiner* — Lan Vinh
*Assistant Examiner* — Jiong-Ping Lu
(74) *Attorney, Agent, or Firm* — Stites & Harbison PLLC; Jeffrey A. Haeberlin; Nicolo Davidson (57) ABSTRACT

In order to provide a method of manufacturing a multilayer wiring substrate, a base member having a copper foil separably laminated thereon is prepared, and a solder resist layer is formed on the copper foil. Openings are formed in the solder resist layer, and a metal conductor portion is formed in each of the openings. By means of sputtering, a dissimilar metal layer is formed over the surface of the metal conductor portion and the entire surface of the solder resist layer. Copper electroplating is performed so as to form connection terminals and a conductor layer on the dissimilar metal layer. After a build-up step, the base material is removed, whereby the copper foil is exposed, and the exposed copper foil and the metal conductor portion are removed through etching, whereby the surfaces of the external connection terminals are exposed from the openings.

11 Claims, 7 Drawing Sheets

METHOD OF MANUFACTURING MULTILAYER WIRING SUBSTRATE

CROSS REFERENCE TO RELATED APPLICATION

The present application claims priority from Japanese Patent Application No. 2010-274542, which was filed on Dec. 9, 2010, the disclosure of which is herein incorporated by reference in its entirety.

BACKGROUND OF THE INVENTION

1. Field of the Invention

The present invention relates to a method of manufacturing a multilayer wiring substrate having a laminate structure in which a plurality of resin insulation layers made primarily of the same resin insulation material and a plurality of conductor layers are laminated alternately in multilayer arrangement, and not having a so-called substrate core in a final product, the substrate core carrying build-up layers successively formed on opposite surfaces thereof.

2. Description of Related Art

In association with recent increasing tendency toward higher operation speed and higher functionality of semiconductor integrated circuit devices (IC chips) used as, for example, microprocessors of computers, the number of terminals increases, and the pitch between the terminals tends to become narrower. Generally, a large number of terminals are densely arrayed on the bottom surface of an IC chip and flip-chip-bonded to terminals provided on a motherboard. However, since the terminals of the IC chip differ greatly in pitch from those of the motherboard, difficulty is encountered in bonding the IC chip directly onto the motherboard. Thus, according to an ordinarily employed method, a semiconductor package configured such that the IC chip is mounted on an IC chip mounting wiring substrate is fabricated, and the semiconductor package is mounted on the motherboard.

The IC chip mounting wiring substrate which partially constitutes such a semiconductor package is practicalized in the form of a multilayer substrate configured such that a build-up layer is formed on the front and back surfaces of a substrate core. The substrate core used in the multilayer wiring substrate is, for example, a resin substrate (glass epoxy substrate or the like) formed by impregnating reinforcement fiber with resin. Through utilization of rigidity of the substrate core, resin insulation layers and conductor layers are laminated alternately on the front and back surfaces of the substrate core, thereby forming respective build-up layers. In the multilayer wiring substrate, the substrate core serves as a reinforcement and is formed very thick as compared with the build-up layers. Also, the substrate core has conductor lines (specifically, through-hole conductors, etc.) extending therethrough for electrical communication between the build-up layers formed on the front and back surfaces.

In recent years, in association with implementation of high operation speeds of semiconductor integrated circuit devices, signal frequencies to be used have become those of a high frequency band. In this case, the conductor lines which extend through the substrate core serve as sources of high inductance, leading to the transmission loss of high-frequency signals and the occurrence of circuitry malfunction and thus hindering implementation of high operation speed. In order to solve this problem, a multilayer wiring substrate having no substrate core is proposed. This multilayer wiring substrate does not use a substrate core, which is relatively thick, thereby reducing the overall wiring length. Thus, the transmission loss of high-frequency signals is lowered, whereby a semiconductor integrated circuit device can be operated at high speed.

In this method of manufacturing a multilayer wiring substrate, a metal foil is disposed on a support substrate (base material), and a plurality of conductor layers and a plurality of resin insulation layers are laminated on the metal foil to thereby form a build-up layer. Subsequently, the metal foil is separated from the support substrate so as to obtain a structure in which the build-up layer is formed on the metal foil. After that, the metal foil is removed through etching so as to expose the surface of the outermost layer of the build-up layer (the surface of the resin insulation layer and the surfaces of a plurality of connection terminals), whereby the multilayer wiring substrate is manufactured. Furthermore, there has been put to practical use a multilayer wiring substrate in which a solder resist layer is formed on the outermost layer of the build-up layer. Notably, the solder resist layer has openings for exposing the surfaces of the connection terminals. The solder resist layer is made primarily of a hardened resin insulation material that is photocurable, and formed on the outermost layer of the build-up layer after the structure is separated from the support substrate. In this case, since the solder resist layer is formed in a state in which the support substrate has been removed (in a coreless state); i.e., in a state in which the structure is composed of the build-up layer only, the structure does not have sufficient strength at that time. Thus, forming the solder resist layer having a uniform thickness becomes difficult, which may result in a decrease in production yield.

In order to solve such a problem, there may be employed a manufacturing method in which a solder resist layer is formed on a support substrate, and a build-up layer is formed on the solder resist layer. Patent Documents 1 and 2 disclose such a manufacturing method.

Related Art Documents

Patent Documents

Patent Document 1 is Japanese Patent Application Laid-open (kokai) No. 2007-13092. Patent Document 2 is Japanese Patent No. 3591524.

BRIEF SUMMARY OF THE INVENTION

Incidentally, in the multilayer wiring substrate disclosed in Patent Document 1, external connection terminals (electrodes) are formed at the interface between the outermost insulation resin layer and a solder resist layer at positions corresponding to openings provided in the solder resist layer, and no wiring pattern is formed on the surface of the solder resist layer where the external connection terminals are present. Therefore, difficulty is encountered in increasing the degree of integration of the multilayer wiring substrate. Meanwhile, in the multilayer wiring substrate disclosed in Patent Document 2, in addition to the external connection terminals, a wiring pattern is formed on the surface of the solder resist layer. Therefore, increasing the degree of integration of the wiring substrate becomes possible. However, in the manufacturing method disclosed in Patent Document 2, projections formed in openings of the solder resist layer are removed through etching along with the above-mentioned metal foil so as to expose the external connection terminals (electrode patterns) from the openings. In this case, through etching, the projection in each opening is removed in such a manner that the removal efficiency increases toward the center of the projection. Thus, it becomes difficult to make the surfaces of the external connection terminals flat. Laser machining or the like must be separately performed in order to adjust the surface shape of the connection terminals. Also, in the case where the degree of integration of the multilayer wiring substrate is increased, the external connection terminals (electrodes) and the wiring pattern become closer to each other, migration of copper which constitutes the electrodes and the wiring may occur.

The present invention has been conceived in view of the above problems, and an object of the invention is to provide a method of manufacturing a multilayer wiring substrate which can reduce the number of manufacturing steps performed after removal of a base material and which can manufacture a multilayer wiring substrate having high reliability.

A means (Means 1) for solving the above problems is a method of manufacturing a multilayer wiring substrate having a laminate structure which has a first main surface and a second main surface and in which a plurality of resin insulation layers made primarily of the same resin insulation material, and a plurality of conductor layers are laminated alternately, wherein a solder resist layer is provided on at least one of the first main surface and the second main surface of the laminate structure, the solder resist layer has a plurality of openings for exposing external connection terminals, and the plurality of conductor layers are connected with one another by via conductors formed in the plurality of resin insulation layers such that their diameters increase toward the first main surface side or the second main surface side. The method includes: a solder resist layer formation step of providing a base member having a copper foil separably laminated thereon, and applying a photosensitive resin insulation material on the copper foil to thereby form the solder resist layer; an opening formation step of forming the plurality of openings in the solder resist layer through exposure and development; a conductor portion formation step of forming a metal conductor portion of copper in each of the plurality of openings of the solder resist layer; a dissimilar metal layer formation step of forming a dissimilar metal layer over a surface of the metal conductor portion and an entire surface of the solder resist layer by a physical film formation process, the dissimilar metal layer being formed of at least one metal which is lower in etching rate than copper; a terminal and wiring formation step, performed after the dissimilar metal layer formation step, of performing copper electroplating to thereby form the external connection terminals on the dissimilar metal layer at positions corresponding to the plurality of openings such that each of the external connection terminals has a diameter greater than that of a corresponding opening, and forming a wiring pattern on the dissimilar metal layer at a position different from the positions of the external connection terminals; a build-up step of alternately laminating the plurality of resin insulation layers and the plurality of conductor layers on the solder resist layer having the external connection terminals and the wiring pattern formed thereon, to thereby form the laminate structure; a base member (material) removal step, performed after the build-up step, of removing the base member (material) to thereby expose the copper foil; and a terminal exposure step of exposing the surfaces of the external connection terminals from the openings by removing the exposed copper foil and the metal conductor portion through etching.

According to the invention described in Means 1, the multilayer wiring substrate is formed such that a plurality of resin insulation layers made primarily of the same resin insulation material, and a plurality of conductor layers are laminated alternately, and assumes the form of a coreless wiring substrate having no substrate core. In the method of manufacturing the multilayer wiring substrate, since the solder resist layer is formed before the base material removal step, the number of manufacturing steps performed after the base material step can be reduced. Also, since the solder resist layer is formed on the base material, as compared with the case where the solder resist layer is formed after the removal of the base material, the solder resist layer can be formed on the multilayer wiring substrate such that it becomes flat and has a uniform thickness. Moreover, in the dissimilar metal layer formation step, the dissimilar metal layer is formed over the entire surface of the solder resist layer by a physical film formation process. Therefore, a sufficient degree of adhesion strength can be secured between the solder resist layer and the dissimilar metal layer. In the terminal and wiring formation step, copper electroplating is performed, while the dissimilar metal layer is used as a seed layer, whereby the connection terminals and the wiring pattern are formed on the solder resist layer. Furthermore, the dissimilar metal layer is formed of a metal which is lower in etching rate than copper. Therefore, in the terminal exposure step, the dissimilar metal layer function as an etching stop layer, and the metal conductor portion in each opening can be removed without fail. As a result, without performance of laser machining or the like employed in conventional techniques, the surfaces of the external connection terminals can be made flat. Moreover, the connection terminals and the wiring pattern, which are formed at the interface between the solder resist layer and the outermost resin insulation layer, are buried in the resin insulation layer, which is excellent in insulating performance, and the dissimilar metal layer is present on the surfaces of the connection terminals and the wiring pattern. In the case where the dissimilar metal layer is formed of a metal which is less likely to migrate as compared with copper, it is possible to prevent occurrence of migration of copper between the connection terminals and the wiring pattern, whereby the degree of integration of the multilayer wiring substrate can be increased.

A means (Means 2) for solving the above problems is a method of manufacturing a multilayer wiring substrate having a laminate structure which has a first main surface and a second main surface and in which a plurality of resin insulation layers made primarily of the same resin insulation material, and a plurality of conductor layers are laminated alternately, wherein a solder resist layer is provided on at least one of the first main surface and the second main surface of the laminate structure, the solder resist layer has a plurality of openings for exposing external connection terminals, and the plurality of conductor layers are connected with one another by via conductors formed in the plurality of resin insulation layers such that their diameters increase toward the first main surface side or the second main surface side. The method included: a solder resist layer formation step of providing a base member having a copper foil separably laminated thereon, and applying a photosensitive resin insulation material on the copper foil to thereby form the solder resist layer; an opening formation step of forming the openings in the plurality of solder resist layer through exposure and development; a dissimilar metal layer formation step of forming a dissimilar metal layer over an entire surface of the solder resist layer, including wall surfaces of the plurality of openings, by a physical film formation process, the dissimilar metal layer being formed of at least one metal which is lower in etching rate than copper; a terminal and wiring formation step, performed after the dissimilar metal layer formation step, of performing copper electroplating to thereby form the external connection terminals such that the external connection terminals fill interiors of the plurality of (corresponding)

openings of the solder resist layer and cover upper ends of the plurality of (corresponding) openings, and forming a wiring pattern on a surface of the solder resist layer at a position different from positions of the external connection terminals; a build-up step of alternately laminating the plurality of resin insulation layers and the plurality of conductor layers on the solder resist layer having the external connection terminals and the wiring pattern formed thereon, to thereby form the laminate structure; a base member (material) removal step, performed after the build-up step, of removing the base member (material) to thereby expose the copper foil; and a terminal exposure step of exposing surfaces of the external connection terminals from the plurality of openings by removing the exposed copper foil through etching.

According to the invention described in Means 2, the multilayer wiring substrate is formed such that a plurality of resin insulation layers made primarily of the same resin insulation material, and a plurality of conductor layers are laminated alternately, and assumes the form of a coreless wiring substrate having no substrate core. In the method of manufacturing the multilayer wiring substrate, since the solder resist layer is formed before the base material removal step, the number of manufacturing steps performed after the base material step can be reduced. Also, since the solder resist layer is formed on the base material, as compared with the case where the solder resist layer is formed after the removal of the base material, the solder resist layer can be formed such that it becomes flat and has a uniform thickness. Moreover, after openings are formed in the solder resist layer, the dissimilar metal layer is formed on the entire surface of the solder resist layer, including the wall surfaces of the openings, by a physical film formation process. Therefore, a sufficient degree of adhesion strength can be secured between the solder resist layer and the dissimilar metal layer. In the terminal and wiring formation step, copper electroplating is performed, while the dissimilar metal layer is used as a seed layer, whereby the connection terminals and the wiring pattern are formed. Since the dissimilar metal layer is formed on the wall surfaces of the openings as well, a copper plating layer can be reliably formed in each of the openings. Accordingly, it becomes possible to restrain variation in thickness of the external connection terminals formed above the openings. Furthermore, the dissimilar metal layer is formed of a metal which is lower in etching rate than copper. Therefore, in the terminal exposure step, the dissimilar metal layer function as an etching stop layer, whereby the copper foil can be removed without fail, and the surfaces of the external connection terminals can be exposed from the openings. Moreover, the connection terminals and the wiring pattern, which are formed at the interface between the solder resist layer and the outermost resin insulation layer, are buried in the resin insulation layer, which is excellent in insulating performance, and the dissimilar metal layer is present on the surfaces of the connection terminals and the wiring pattern. In the case where the dissimilar metal layer is formed of a metal which is less likely to migrate as compared with copper, it is possible to prevent occurrence of migration of copper between the connection terminals and the wiring pattern, whereby the degree of integration of the multilayer wiring substrate can be increased.

In the terminal and wiring formation step, a resist layer formation step is performed so as to form on the dissimilar metal layer a plating resist layer having first openings at positions corresponding to the openings of the solder resist layer, the first openings being greater in area than the openings, and a second opening corresponding to the wiring pattern. Subsequently, a copper electroplating step is performed so as to form the external connection terminals in the first openings, and the wiring pattern in the second opening. Subsequently, a resist removal step of removing the plating resist layer and a dissimilar metal layer removal step of partially removing the dissimilar metal layer by etching exposed portions of the dissimilar metal layer are performed before the build-up step. In this case, the external connection terminals can be formed at positions corresponding to the openings of the solder resist layer, and the wiring pattern can be formed at a position different from the positions of the external connection terminals.

The dissimilar metal layer may be formed of at least one metal selected from the group consisting of gold, nickel, chromium, titanium, cobalt, palladium, tin, and silver. Preferably, the dissimilar metal layer is formed through sputtering. In this case, a dissimilar metal layer which is excellent in adhesion can be reliably formed over the entire surface of the solder resist layer.

In the conductor portion formation step, preferably, the metal conductor portion is formed in each of the openings of the solder resist layer by performing copper electroplating. In this case, the metal conductor portion of copper can be easily formed in each of the openings of the solder resist layer.

The via conductors formed in the plurality of resin insulation layers may be shaped such that their diameters increase from the first main surface side toward the second main surface side. By contrast, the via conductors formed in the plurality of resin insulation layers may also be shaped such that their diameters increase from the second main surface side toward the first main surface side. Through employment of this diametral feature, a coreless wiring substrate having no substrate core can be reliably manufactured.

Notably, the solder resist layer may be formed on one main surface side on which an IC chip is to be mounted, or on the side opposite the main surface; specifically, on the other main surface side to which a motherboard is to be connected.

The material of the plurality of resin insulation layers which partially constitute the multilayer wiring substrate can be selected freely in consideration of electrical insulation performance, heat resistance, humidity resistance, etc. Preferred examples of the material used to form the resin insulation layers include thermosetting resins, such as epoxy resin, phenol resin, urethane resin, silicone resin, and polyimide resin; and thermoplastic resins, such as polycarbonate resin, acrylic resin, polyacetal resin, and polypropylene resin. Additionally, there may be used a composite material consisting of any one of these resins, and glass fiber (glass woven fabric or glass nonwoven fabric) or organic fiber, such as polyamide fiber, or a resin-resin composite material in which a three-dimensional network fluorine-containing resin base material, such as continuously porous PTFE, is impregnated with a thermosetting resin, such as epoxy resin. Notably, in the present invention, "a plurality of resin insulation layers made primarily of the same resin insulation material" may be a plurality of resin insulation layers which differ in additive, such as the above-mentioned organic fiber, which is mixed with, for example, thermo setting resin, if the resin insulation layers are mainly formed of the same thermo setting resin. Also, the "solder resist layer" refers to as a resist layer which is formed of a heat resistant coating material and which prevents adhesion of solder to a surface on which soldering work is performed.

Since the solder resist layer is mainly formed of a hardened resin insulation material which is photocurable, in general, the solder resist layer is inferior to the inner resin insulation layers in terms of insulation performance. Accordingly, as in the case of the present invention, the conductor layer present at the interface between the solder resist layer and the outermost resin insulation layer is desired to be buried in the outermost resin insulation layer. When such a configuration is employed, a resin insulation layer which is high in insulation performance is interposed between the conductor layers, such as wiring patterns, the wiring patterns can be provided at a relatively narrow pitch, whereby the degree of integration of the multilayer wiring substrate can be increased.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

First Embodiment

Figure 1:
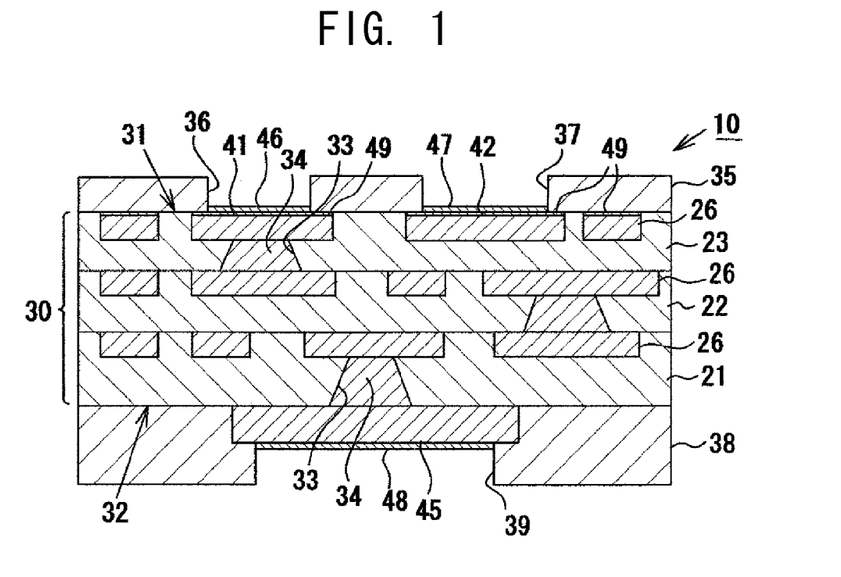
FIG. 1 is an enlarged sectional view schematically showing the structure of a multilayer wiring substrate according to a first embodiment.
Figure 2:
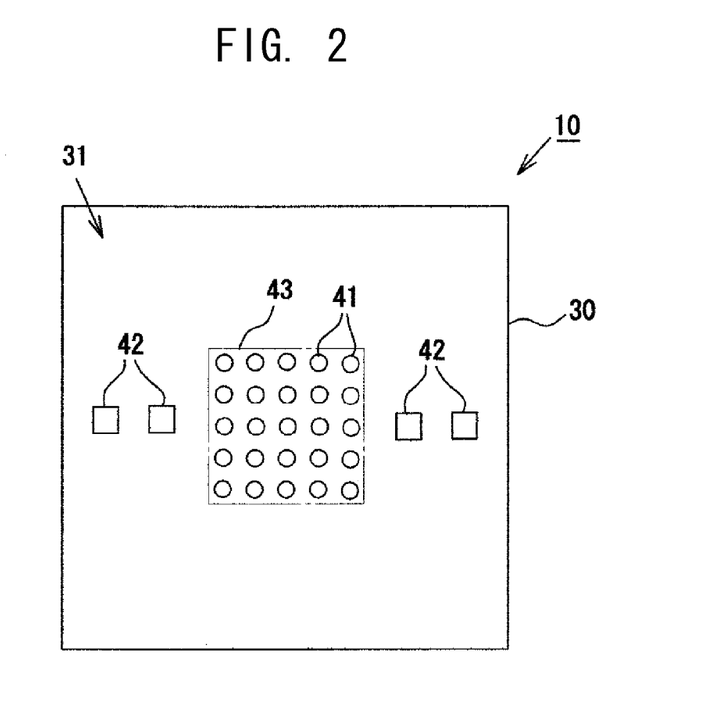
FIG. 2 is a plan view schematically showing the structure of the multilayer wiring substrate according to the first embodiment.
Figure 3:
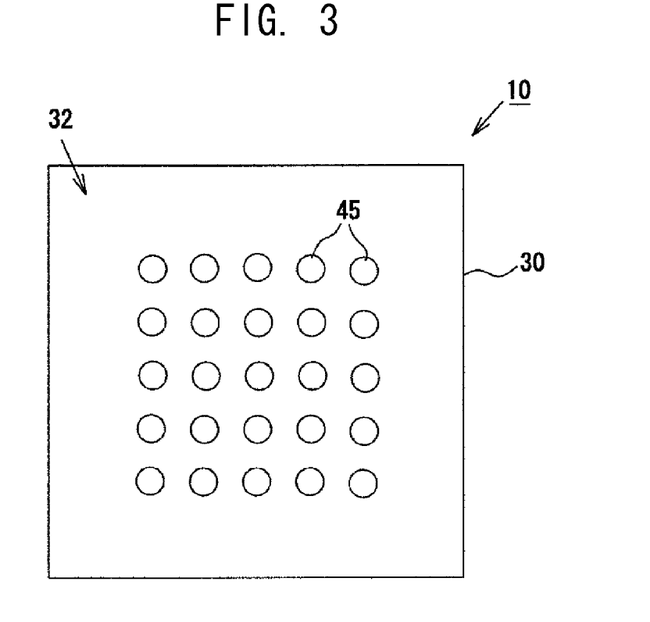
FIG. 3 is a plan view schematically showing the structure of the multilayer wiring substrate according to the first embodiment.

A multilayer wiring substrate according to a first embodiment of the present invention will next be described in detail with reference to the drawings. FIG. 1 is an enlarged sectional view schematically showing the structure of the multilayer wiring substrate of the present embodiment. FIG. 2 is a plan view of the multilayer wiring substrate as viewed from the top surface side. FIG. 3 is a plan view of the multilayer wiring substrate as viewed from the bottom surface side.

As shown in FIG. 1, a multilayer wiring substrate 10 is a coreless wiring substrate having no substrate core and has a multilayer wiring laminate portion 30 (laminate structure) in which three resin insulation layers 21, 22, and 23 made primarily of the same resin insulation material, and a plurality of conductor layers 26 made of copper are laminated alternately. The resin insulation layers 21 to 23 are formed of a build-up material made primarily of a hardened resin insulation material that is not photocurable; specifically, a hardened thermosetting epoxy resin. In the multilayer wiring substrate 10, a plurality of external connection terminals 41 and 42 are disposed on the side toward a top surface 31 (first main surface) of the wiring laminate portion 30.

As shown in FIGS. 1 and 2, the multilayer wiring substrate 10 of the present embodiment has a plurality of external connection terminals disposed on the side toward the top surface 31 of the wiring laminate portion 30. The external connection terminals include IC-chip connection terminals 41 to which an IC chip is connected and capacitor connection terminals 42 to which chip capacitors are connected. On the side toward the top surface 31 of the wiring laminate portion 30, the plurality of IC-chip connection terminals 41 are arrayed in a chip mounting region 43 provided at a central portion of the multilayer wiring substrate 10. The capacitor connection terminals 42 are greater in area than the IC-chip connection terminals 41 and are disposed externally of the chip mounting region 43.

Meanwhile, as shown in FIGS. 1 and 3, on the side toward a bottom surface 32 (second main surface) of the wiring laminate portion 30, a plurality of connection terminals 45 for LGA (land grid array) to which a motherboard is connected are arrayed. The motherboard connection terminals 45 are greater in area than the IC-chip connection terminals 41 and the capacitor connection terminals 42 on the top surface 31 side.

Via holes 33 and filled-via conductors 34 are provided in the resin insulation layers 21, 22, and 23. The via conductors 34 are shaped such that their diameters increase in the same direction (in FIG. 1, in the direction from the top surface 31 side toward the bottom surface 32 side). The via conductors 34 electrically interconnect the conductor layers 26, the IC-chip connection terminals 41, the capacitor connection terminals 42, and the motherboard connection terminals 45.

On the side toward the top surface 31 of the wiring laminate portion 30, the surface of the outermost resin insulation layer 23 is almost completely covered with a solder resist layer 35. The solder resist layer 35 has a plurality of openings 36, 37 formed therein so as to expose the IC-chip connection terminals 41 and the capacitor connection terminals 42. The IC chip connection terminals 41 and the capacitor connection terminals 42 do not project into the solder resist layer 35, and are buried in the resin insulation layers 23. The IC chip connection terminals 41 are greater than the openings 36, and peripheral portions of the outer surfaces of these terminals are covered with the solder resist layer 35. The capacitor connection terminals 42 are greater than the openings 37, and peripheral portions of the outer surfaces of these terminals are covered with the solder resist layer 35. Each of the IC chip connection terminals 41 and the capacitor connection terminals 42 is mainly formed of a copper layer, and has a structure in which only the upper surface of the copper layer exposed to the interior of the opening 36, 37 is covered with a plating layer 46, 47 of a metal other than copper (specifically, a nickel plating layer and a gold plating layer).

On the side toward the bottom surface 32 of the wiring laminate portion 30, the surface of the outermost resin insulation layers 21 is almost completely covered with the solder resist layer 38, which has a plurality of openings 39 for exposing the motherboard connection terminals 45. The motherboard connection terminals 45 are embedded in the openings 39 such that the motherboard connection terminals 45 are located outward of the surface of the resin insulation layer 21. The motherboard connection terminals 45 are greater than the openings 39, and peripheral portions of the outer surfaces of these terminals are covered with the solder resist layer 38. Each of the motherboard connection terminals 45 is mainly formed of a copper layer, and has a structure in which only the lower surface of the copper layer exposed to the interior of the opening 39 is covered with a plating layer 48 of a metal other than copper (specifically, a nickel plating layer and a gold plating layer). A motherboard is connected to the motherboard connection terminals 45 via unillustrated solder.

Furthermore, in the multilayer wiring substrate 10, in addition to the connection terminals 41, 42, a conductor layer 26 for forming wiring patterns is formed at the interface between the resin insulation layer 23 and the solder resist layer 35. As in the case of the connection terminals 41, 42, the conductor layer 26 is buried in the resin insulation layer 23, and does not project into the solder resist layer 35. Moreover, a dissimilar metal layer 49 is formed on the surfaces of the connection terminals 41, 42 and the conductor layer 26, which are formed at the interface between the resin insulation layer 23 and the solder resist layer 35, wherein the surfaces are in contact with the solder resist layer 35. The dissimilar metal layer 49 is a film formed through sputtering (physical film formation process), and formed of a metal (e.g., nickel) which is lower in etching rate than copper. Notably, the plating layers 46, 47 for the connection terminals 41, 42 are formed on the corresponding surface areas of the dissimilar metal layer 49 exposed from the openings 36, 37.

The multilayer wiring substrate 10 having the above-described structure is manufactured by, for example, the following procedure.

First, a support substrate (a glass epoxy substrate or the like) having sufficient strength is prepared. On the support substrate, the resin insulation layers 21 to 23 and the conductor layers 26 are alternately built up, thereby forming the wiring laminate portion 30.

Figure 4:
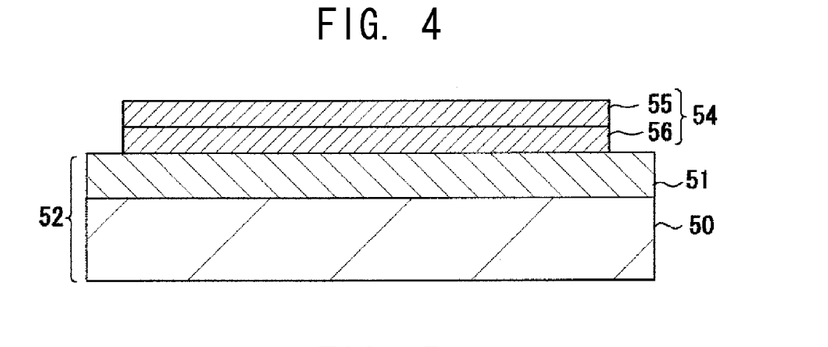
FIG. 4 is an explanatory view showing a method of manufacturing the multilayer wiring substrate according to the first embodiment.

More specifically, as shown in FIG. 4, a sheet-like electrically insulative resin base material made of epoxy resin and serving as a ground resin insulation layer 51 is attached onto a support substrate 50, thereby yielding a base material 52 consisting of the support substrate 50 and the ground resin insulation layer 51. Then, a metal laminate sheet 54 is disposed on the upper surface of the ground resin insulation layer 51 of the base material 52. Through disposition of the metal laminate sheet 54 on the ground resin insulation layer 51, there is ensured such adhesion that, in the subsequent fabrication process, the metal laminate sheet 54 is not separated from the ground resin insulation layer 51. The metal laminate sheet 54 is configured such that two copper foils 55 and 56 separably adhere with each other. Specifically, the copper foils 55 and 56 are laminated together with metal plating (e.g., chromium plating, nickel plating, titanium plating, or composite plating thereof) intervening therebetween, thereby forming the metal laminate sheet 54.

Figure 5:
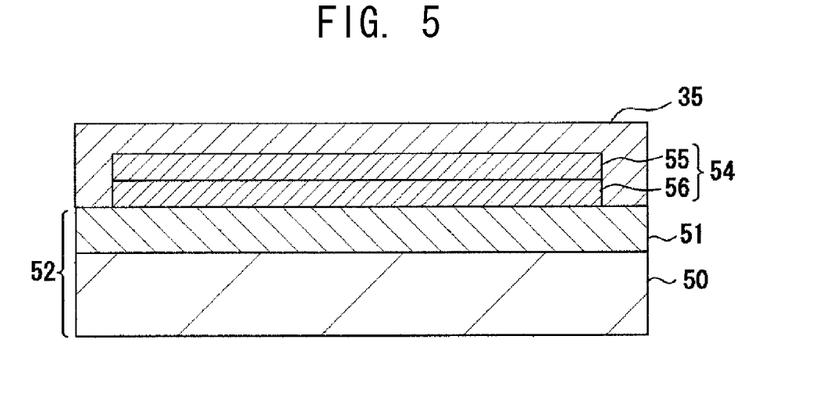
FIG. 5 is an explanatory view showing the method of manufacturing the multilayer wiring substrate according to the first embodiment.
Figure 6:
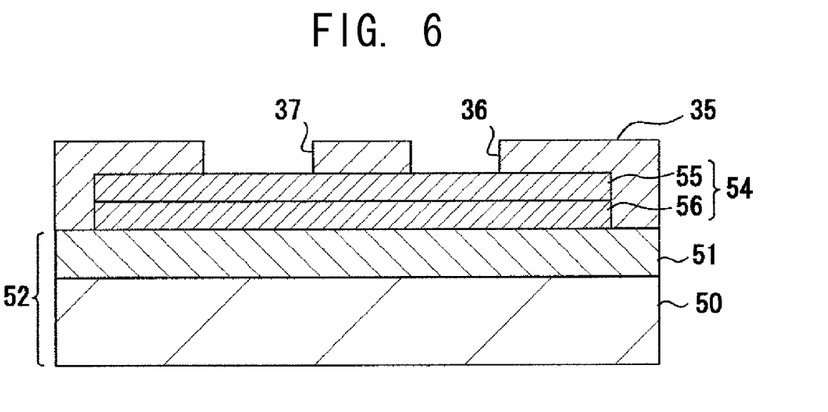
FIG. 6 is an explanatory view showing the method of manufacturing the multilayer wiring substrate according to the first embodiment.

Next, photosensitive epoxy resin is applied onto the base material 52 such that the epoxy resin covers the laminate metal sheet 54, and is cured, whereby the solder resist layer 35 as shown in FIG. 5 is formed (solder resist layer formation step). This solder resist layer 35 adheres to the laminate metal sheet 54 and adheres to the ground resin insulation layer 51 in a region around the laminate metal sheet 54, to thereby seal the laminate metal sheet 54. Subsequently, exposure and development are performed with a predetermined mask placed on the solder resist layer 35, whereby, as shown in FIG. 6, the openings 36, 37 are formed in the solder resist layer 35 (opening formation step).

Figure 7:
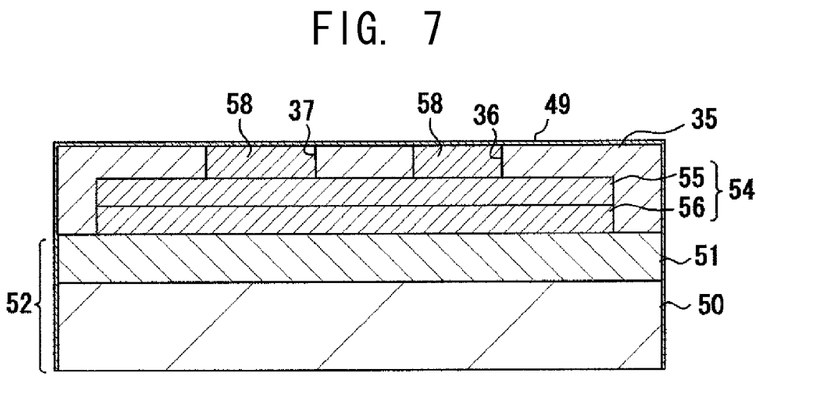
FIG. 7 is an explanatory view showing the method of manufacturing the multilayer wiring substrate according to the first embodiment.

After that, copper electroplating is performed so as to form metal conductor portions 58 in the openings 36, 37 of the solder resist layer 35 (conductor portion forming step). Subsequently, sputtering (physical film formation process) is performed (dissimilar metal layer formation step). As a result, as shown in FIG. 7, there is formed the dissimilar metal layer 49, which covers the surfaces of the metal conductor portions 58 and the entire surface of the solder resist layer 35.

Figure 8:
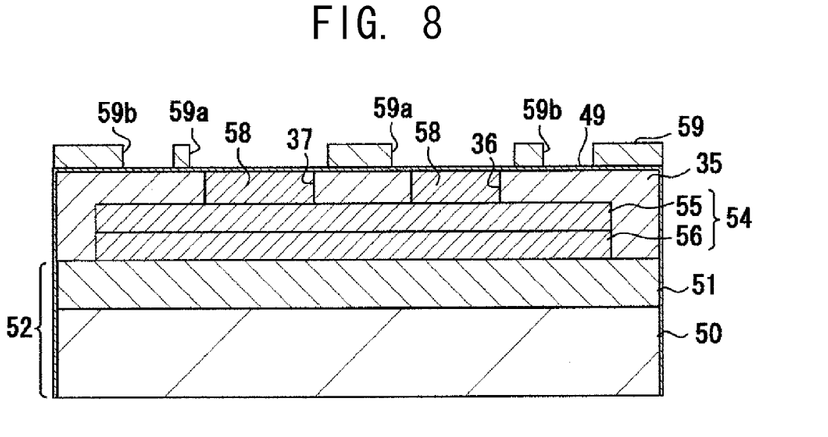
FIG. 8 is an explanatory view showing the method of manufacturing the multilayer wiring substrate according to the first embodiment.
Figure 9:
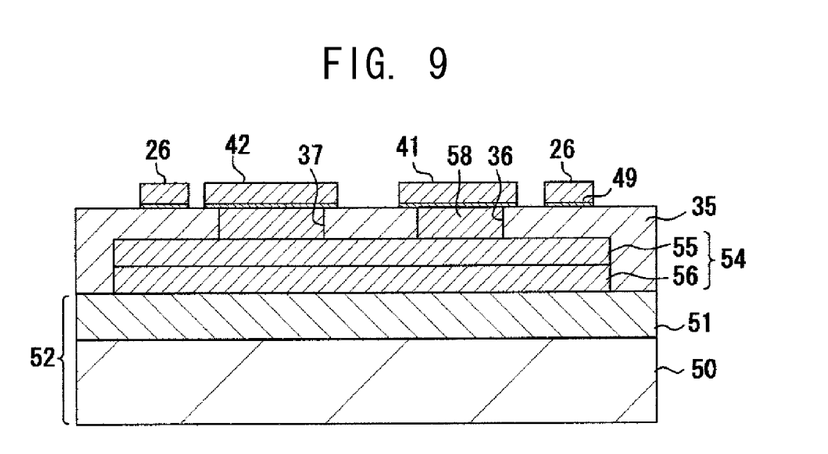
FIG. 9 is an explanatory view showing the method of manufacturing the multilayer wiring substrate according to the first embodiment.

A dry film for forming a plating resist layer is laminated on the upper surface of the solder resist layer 35 with the dissimilar metal layer 49 formed thereon, and exposure and development are performed for the dry film. As a result, as shown in FIG. 8, a plating resist layer 59 having first openings 59a and second openings 59b is formed (resist layer formation step). The first openings 59a are located at positions corresponding to the openings 36, 37 of the solder resist layer 35, and are greater in area than the openings 36, 37. The second openings 59b correspond to the wiring patterns of the conductor layer 26. Through selective performance of copper electroplating with the plating resist layer 59, the connection terminals 41, 42 are formed on the dissimilar metal layer 49 at positions corresponding to the openings 36, 37 (within the first openings 59a), and the wiring patterns of the conductor layer 26 are formed on the dissimilar metal layer 49 at positions different from those of the connection terminals 41, 42 (within the second openings 59b) (terminal and wiring formation step). After that, the plating resist layer 59 is removed (resist layer removal step). Further, through etching, as shown in FIG. 9, portions of the dissimilar metal layer 49 exposed at the surface of the solder resist layer 35 are removed (dissimilar metal layer removal step). Furthermore, in order to enhance adhesion between the resin insulation layer 23 and the contact terminals 41, 42 and the conductor layer 26, the surfaces of the contact terminals 41, 42 and the conductor layer 26 are roughened (treatment performed by use of a CZ-series etching agent available from MEC Co., Ltd.).

Figure 10:
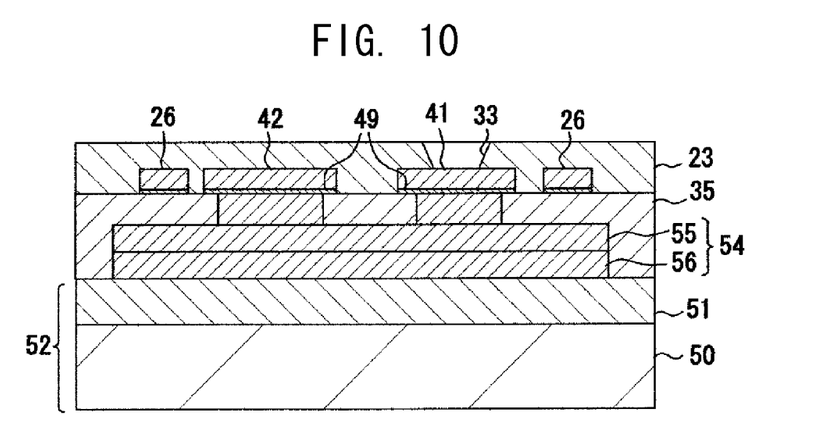
FIG. 10 is an explanatory view showing the method of manufacturing the multilayer wiring substrate according to the first embodiment.

After that, a sheet-like resin insulation layer 23 is disposed on and attached onto the solder resist layer 35 in such a manner as to cover the connection terminals 41, 42 and the conductor layer 26. Subsequently, the via holes 33 are formed in the resin insulation layer 23 at predetermined positions by means of performing laser machining by use of, for example, an excimer laser, a UV laser, or a $CO_2$ laser (see FIG. 10). Next, by use of etchant, such as a potassium permanganate solution, a desmear step is performed for removing smears from inside the via holes 33. In the desmear step, in place of treatment by use of etchant, plasma asking by use of, for example, $O_2$ plasma may be performed.

Figure 11:
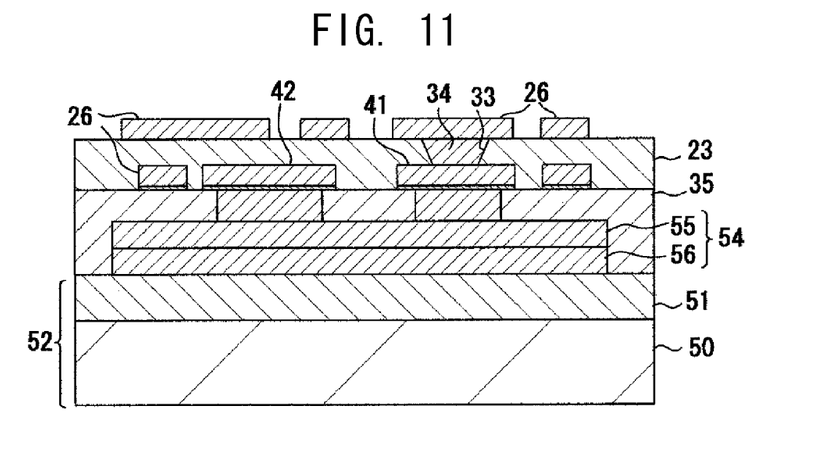
FIG. 11 is an explanatory view showing the method of manufacturing the multilayer wiring substrate according to the first embodiment.

After the desmear step, electroless copper plating and copper electroplating are performed by a known process, thereby forming the via conductors 34 in the via holes 33. Further, etching is performed by a known process (e.g., semi-additive process), thereby forming the conductor layer 26 in a predetermined pattern on the resin insulation layer 23 (see FIG. 11).

Also, other resin insulation layers 22 and 21 and the corresponding conductor layers 26 are formed and laminated on the resin insulation layer 23 by processes similar to those used to form the resin insulation layer 23 and the associated conductor layers 26 (build up step). Subsequently, the motherboard connection terminals 45 are formed on the outermost resin layer 21. Furthermore, photosensitive epoxy resin is applied onto the outermost resin layer 21 and is cured so as to form the solder resist layer 38. Exposure and development are then performed with a predetermined mask placed thereon so as to form the openings 39 in the solder resist layer 38. As a result, central portions of the motherboard connection terminals 45 are exposed from the openings 39 of the solder resist layer 38 (see FIG. 12).

Figure 12:
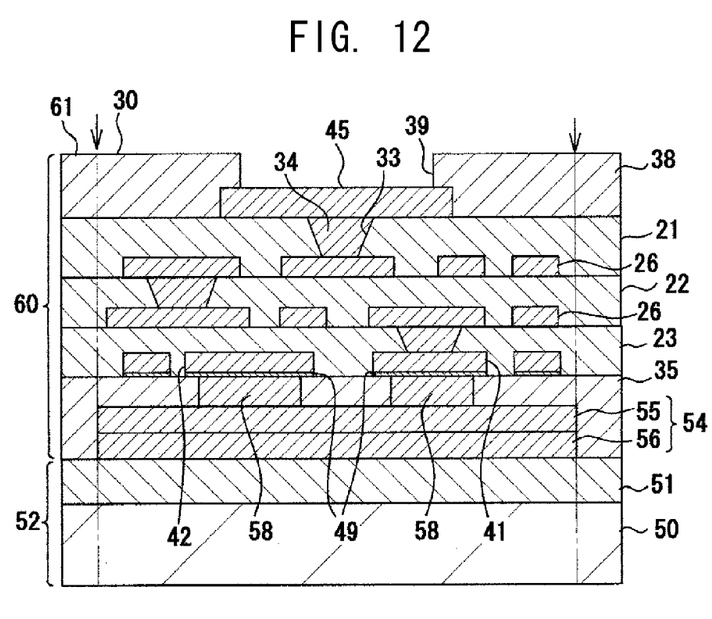
FIG. 12 is an explanatory view showing the method of manufacturing the multilayer wiring substrate according to the first embodiment.

By the above-described build-up step, there is formed a wiring laminate 60 in which the metal laminate sheet 54, the resin insulation layers 21 to 23, and the conductor layers 26 are laminated on the base material 52. Notably, as shown in FIG. 12, a portion of the wiring laminate 60 which is located above the metal laminate sheet 54 will become the wiring laminate portion 30 of the multilayer wiring substrate 10.

After the build-up step, the wiring laminate 60 is cut by a dicing apparatus (not shown) so as to remove a surrounding portion around the wiring laminate portion 30. At this time, as shown in FIG. 12, the wiring laminate 60 is cut together with the base material 52 (the support substrate 50, and the ground resin insulation layer 51) located under the wiring laminate portion 30, along the boundary (indicated by the arrows in FIG. 12) between the wiring laminate portion 30 and a surrounding portion 61. As a result of this cutting, a peripheral edge portion of the metal laminate sheet 54 which has been sealed by the solder resist layer 35 is exposed. That is, as a result of removal of the surrounding portion 61, adhesion between the ground resin insulation layer 51 and the solder resist layer 35 is lost. In this state, the wiring laminate portion 30 and the base material 52 are connected together merely through the metal laminate sheet 54.

Figure 13:
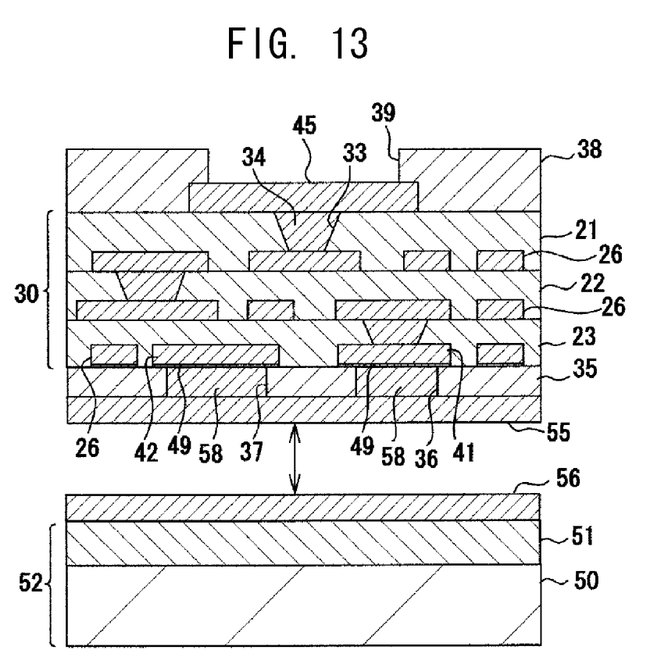
FIG. 13 is an explanatory view showing the method of manufacturing the multilayer wiring substrate according to the first embodiment.
Figure 14:
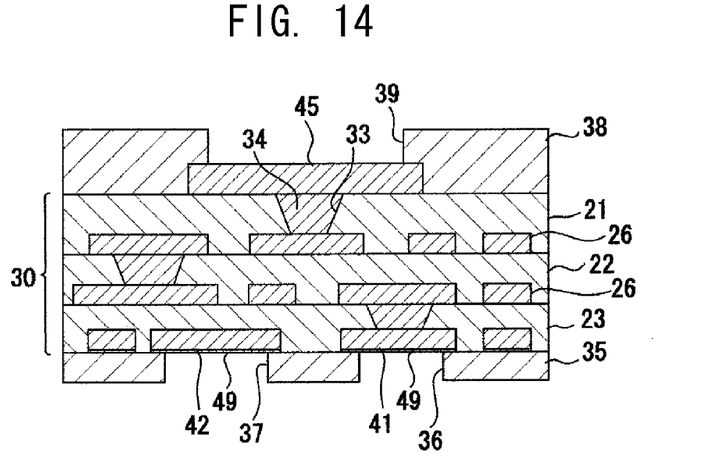
FIG. 14 is an explanatory view showing the method of manufacturing the multilayer wiring substrate according to the first embodiment.

As shown in FIG. 13, the wiring laminate portion 30 and the base material 52 are separated from each other at the interface between the copper foils 55 and 56 of the metal laminate sheet 54, thereby removing the base material 52 from the wiring laminate portion 30 and exposing the copper foil 55 present on the bottom surface of the wiring laminate portion 30 (the solder resist layer 35) (base material removal step). Furthermore, on the bottom surface side of the wiring laminate portion 30, the exposed copper foil 55 and the metal conductor portions 58 are removed through etching (terminal exposure step). Specifically, a dry film for forming an etching resist layer is laminated on the top surface of the wiring laminate portion 30 (the solder resist layer 38), and exposure and development are performed for the dry film to thereby form an etching resist layer which covers the entirety of the top surface of the solder resist layer 38. In this state, etching is performed for the wiring laminate portion 30 so as to remove the entire copper foil 55, and remove the metal conductor portions 58. As a result, the openings 36, 37 are formed in the solder resist layer 35, and the surfaces of the IC-chip connection terminals 41 and the capacitor connection terminals 42 are exposed (see FIG. 14). At that time, since the dissimilar metal layer 49 formed on the surfaces of the connection terminals 41, 42 is lower in etching rate than copper, the dissimilar metal layer 49 serves as an etching stop layer, and remains on the surfaces of the terminals.

After that, electroless nickel plating and electroless gold plating are successively performed on the surfaces of the IC-chip connection terminals 41, the capacitor connection terminals 42, and the motherboard connection terminals 45, to thereby form plating layers 46, 48, 47, each composed of a nickel plating layer and a gold plating layer. The multilayer wiring substrate 10 of FIG. 1 is manufactured through the above-described steps.

Therefore, the present embodiment can yield the following effects.

(1) In the present embodiment, since the solder resist layer 35 is formed before the base material removal step, the number of manufacturing steps performed after the base material step can be reduced. Also, since the solder resist layer 35 is formed on the base material 52 having the form of a flat plate, as compared with the case where the solder resist layer 35 is formed after removal of the base material, the solder resist layer 35 can be formed such that it becomes flat and has a uniform thickness. Moreover, since the dissimilar metal layer 49 is formed on the entire surface of the solder resist layer 35 through sputtering, a sufficient degree of adhesion strength can be secured between the solder resist layer 35 and the dissimilar metal layer 49.

(2) In the present embodiment, copper electroplating is performed, while the dissimilar metal layer 49 is used as a seed layer, whereby the connection terminals 41, 42 and the wiring patterns of the conductor layer 26 are formed on the solder resist layer 35. Furthermore, since the dissimilar metal layer 49 is formed of a metal which is lower in etching rate than the copper layer which mainly constitutes the metal conductor portions 58, the dissimilar metal layer 49 functions as an etching stop layer. That is, in the terminal exposure step, etching can be controlled such that the metal conductor portions 58 are removed gradually through etching, and the removal through etching stops at the dissimilar metal layer 49. Therefore, without performance of laser machining or the like employed in conventional techniques, the flatness of the surfaces of the connection terminals 41, 42 can be secured sufficiently, and the manufacturing process can be simplified.

(3) In the present embodiment, the connection terminals 41, 42 and the wiring patterns of the conductor layer 26, which are formed at the interface between the solder resist layer 35 and the outermost resin insulation layer 23, do not project into the solder resist layer 35, and are buried in the resin insulation layer 23, which is excellent in insulating performance. In such a configuration, the resin insulation layer 23, which is excellent in insulating performance, is present between the conductor layer 26 and the connection terminals 41, 42. Moreover, the dissimilar metal layer 49 is present on the surfaces of the connection terminals 41, 42 and the wiring patterns of the conductor layer 26. The dissimilar metal layer 49 is formed of a metal (e.g., nickel) which is less likely to migrate, as compared with copper. Accordingly, it is possible to prevent occurrence of migration of copper between the connection terminals 41, 42 and the wiring patterns of the conductor layer 26. As a result, the wiring patterns of the conductor layer 26 and the connection terminals 41, 42 can be provided at relatively narrow pitches, whereby the degree of integration of the multilayer wiring substrate 10 can be increased.

Second Embodiment

Next, a second embodiment of the present invention will be described with reference to the drawings.

The present embodiment differs from the first embodiment in the position of the dissimilar metal layer formation step. This difference will be described below.

Figure 15:
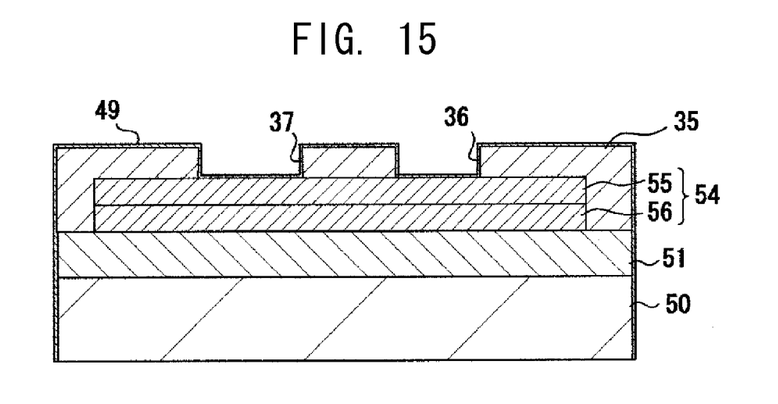
FIG. 15 is an explanatory view showing a method of manufacturing the multilayer wiring substrate according to a second embodiment.
Figure 16:
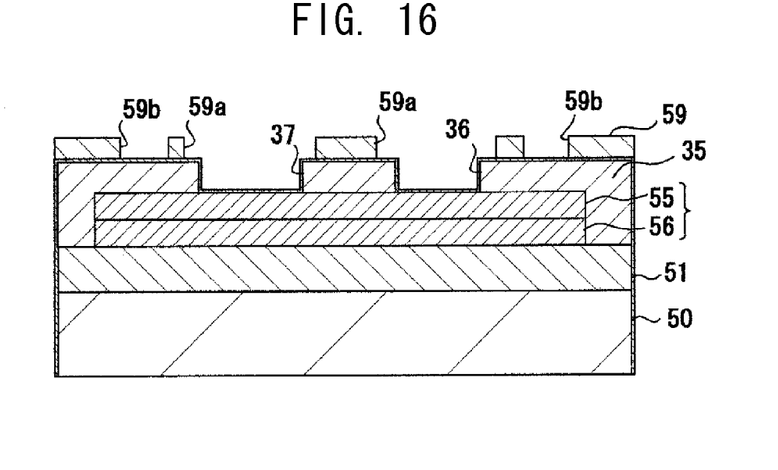
FIG. 16 is an explanatory view showing the method of manufacturing the multilayer wiring substrate according to the second embodiment.

A multilayer wiring substrate 10 of the present embodiment is manufactured by the following procedure. First, steps similar to those of the first embodiment are performed, whereby the solder resist layer 35 is formed on the base material 52 to cover the laminate metal sheet 54 as shown in FIG. 6, and then exposure and development are performed to thereby form the openings 36, 37 in the solder resist layer 35. Subsequently, as shown in FIG. 15, through sputtering, there is formed the dissimilar metal layer 49, which covers the entire surfaces of the solder resist layer 35 and the base material 52 (dissimilar metal layer formation step). Notably, at that time, the dissimilar metal layer 49 is formed on the circumferential wall surface and the bottom surface of each of the openings 36, 37. After that, a dry film for forming a plating resist layer is laminated on the upper surface of the solder resist layer 35 with the dissimilar metal layer 49 formed thereon, and exposure and development are performed for the dry film. As a result, there is formed the plating resist layer 59 having the first openings 59a and the second openings 59b at positions corresponding to the connection terminals 41, 42 and the wiring pattern of the conductor layer 26 (see FIG. 16).

Figure 17:
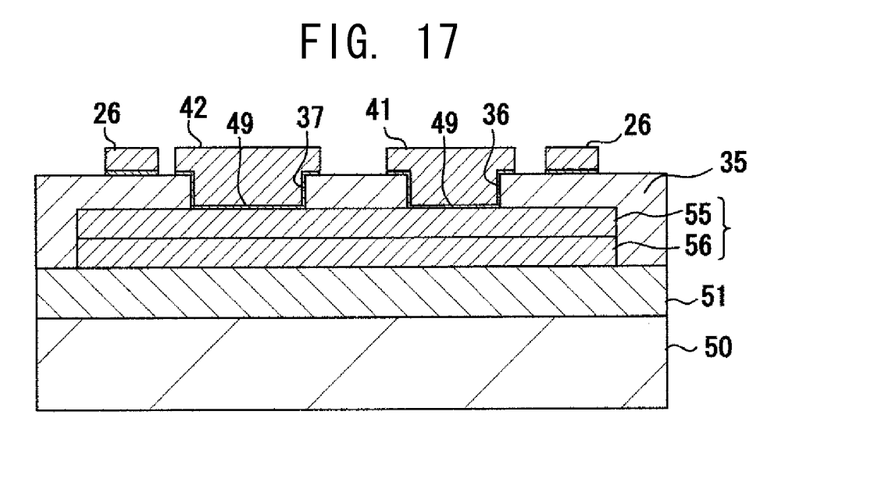
FIG. 17 is an explanatory view showing the method of manufacturing the multilayer wiring substrate according to the second embodiment.

Subsequently, copper electroplating is selectively performed with the plating resist layer 59 formed on the dissimilar metal layer 49, the connection terminals 41, 42 and the conductor layer 26 are formed on the dissimilar metal layer 49. After that, the plating resist layer 59 is peeled off. Furthermore, through etching, portions of the dissimilar metal layer 49 exposed at the surface of the solder resist layer 35 are removed (see FIG. 17).

After that, a build-up step is performed in a manner similar to that in the above-described first embodiment, whereby there is formed the wiring laminate 60 in which the metal laminate sheet 54, the resin insulation layers 21 to 23, and the conductor layers 26 are laminated on the base material 52. The wiring laminate 60 is cut by a dicing apparatus so as to remove the surrounding portion around the wiring laminate portion 30.

Subsequently, the wiring laminate portion 30 and the base material 52 are separated from each other at the interface between the copper foils 55 and 56 of the metal laminate sheet 54, thereby removing the base material 52 from the wiring laminate portion 30 and exposing the copper foil 55 present on the bottom surface of the wiring laminate portion 30 (the solder resist layer 35). Furthermore, on the bottom surface side of the wiring laminate portion 30, the exposed copper foil 55 is removed through etching. At that time, the dissimilar metal layer 49 provided on the bottom surfaces of the openings 36, 37 serves as an etching stop layer, and remains on the bottom surfaces of the openings 36, 37. As a result, there is established a state in which the dissimilar metal layer 49 is exposed to the interiors of the openings 36, 37 of the solder resist layer 35.

Subsequently, the dissimilar metal layer 49 is removed through use of etchant for nickel, whereby the copper layer is exposed within the openings 36, 37. Furthermore, the copper layer within the openings 36, 37 is removed through use of etchant for copper, whereby the lower surfaces of the IC chip connection terminals 41 and the capacitor connection terminals 42 are exposed from the openings 36, 37.

After that, electroless nickel plating and electroless gold plating are successively performed on the surfaces of the IC-chip connection terminals 41, the capacitor connection terminals 42, and the motherboard connection terminals 45, to thereby form the plating layers 46, 48, 47, each composed of a nickel plating layer and a gold plating layer. The multilayer wiring substrate 10 is manufactured through the above-described steps.

In the present embodiment as well, effects similar to those of the first embodiment can be attained. Furthermore, since the dissimilar metal layer 49 is formed on the circumferential wall surface and the bottom surface of each opening 36, 37, a cupper plating layer can be reliably formed within the opening 36, 37 through copper electroplating. Accordingly, it is possible to reliably restrain variation in the thickness of the connection terminals 41, 42 formed above the opening 36, 37.

Notably, the embodiments of the present invention may be modified as follows.

In the above-described embodiments, the dissimilar metal layer 49 is formed through sputtering. However, the method of forming the dissimilar metal layer 49 is not limited thereto, and the dissimilar metal layer 49 may be formed by another physical film formation process, such as vapor deposition, ion plating, or MBE. Also, the dissimilar metal layer 49 may be formed of a metal other than nickel, for example, gold, chromium, titanium, or cobalt.

In the above-described second embodiment, the connection terminals 41, 42 are formed by means of removing, through etching, the dissimilar metal layer 49 exposed within the openings 36, 37 and the cupper layer within the opening 36, 37. However, the method of forming the connection terminals 41, 42 is not limited thereto. For example, the IC chip connection terminals 41 and the capacitor connection terminals 42 may be formed by means of leaving the dissimilar metal layer 49 and the cupper layer within the openings 36, 37, and providing the plating layers 46, 47 on the portions of the dissimilar metal layer 49 exposed from the openings 36, 37.

In the above-described first embodiment, the metal conductor portions 58 are formed within the openings 36, 37 by means of performing copper electro plating. However, the method of forming the metal conductor portions 58 is not limited thereto, and the metal conductor portions 58 may be formed within the openings 36, 37 by use of anther process such as printing.

In the above-described embodiments, the multilayer wiring substrate 10 is fabricated by stacking the resin insulation layer 23 to 21 and the conductor layers 26 from the top surface 31 (first main surface) side where the IC-chip connection terminals 41 and the capacitor connection terminals 42 are formed. However, the present invention is not limited thereto. The multilayer wiring substrate may be fabricated by stacking the resin insulation layer 21 to 23 and the conductor layers 26 from the bottom surface 32 (second main surface) side where the motherboard connection terminals 45 are formed. In this case, the plurality of the conductor layers 26 formed in the plurality of resin insulation layers 21 to 23 are connected with one another via the via conductors 34 whose diameters increase from the lower surface 32 side toward the upper surface 31 side.

In the above-described embodiments, each of the plating layers 46, 47, 48 covering the connection terminals 41, 42, 45 is a nickel-gold plating layer. However, any plating layer may be used so long as the plating layer is made of metal other than copper. For example, the nickel-gold plating layer may be replaced with any other plating layer such as a nickel-palladium-gold plating layer.

Next, technical ideas that the embodiments described above implement are enumerated below.

(1) In the method of manufacturing a multilayer wiring substrate according to Means 1, in the conductor portion formation step, copper electroplating is performed so as to form the metal conductor portions within the openings of the solder resist layer.

(2) In the method of manufacturing a multilayer wiring substrate according to either of Means 1 and 2, the solder resist layer is formed on the first main surface, and the via conductors formed in the plurality of resin insulation layers have a shape such that their diameters increase from the first main surface side toward the second main surface side.

Description of Reference Numerals

10: multilayer wiring substrate
21 to 23: resin insulation layer
26: conductor layer
30: wiring laminate portion (laminate structure)
31: top surface (first main surface)
32: bottom surface (second main surface)
34: via conductor
35: solder resist layer
36, 37: opening
41: IC chip connection terminal (external connection terminal)
42: capacitor connection terminal (external connection terminal)
49: dissimilar metal layer
52: base material
55: copper foil
58: metal conductor portion
59: plating resist layer
59a: first opening
59b: second opening

What is claimed is:

1. A method of manufacturing a multilayer wiring substrate having a laminate structure which has a first main surface and a second main surface and in which a plurality of resin insulation layers made primarily of the same resin insulation material, and a plurality of conductor layers are laminated alternately, wherein a solder resist layer is provided on at least one of the first main surface and the second main surface of the laminate structure, the solder resist layer has a plurality of openings for exposing external connection terminals, and the plurality of conductor layers are connected with one another by via conductors formed in the plurality of resin insulation layers such that their diameters increase toward the first main surface side or the second main surface side, the method comprising:

a solder resist layer formation step of providing a base member having a copper foil separably laminated thereon, and applying a photosensitive resin insulation material on the copper foil to thereby form the solder resist layer;

an opening formation step of forming the plurality of openings in the solder resist layer through exposure and development;

a conductor portion formation step of forming a metal conductor portion of copper in each of the plurality of openings of the solder resist layer;

a dissimilar metal layer formation step of forming a dissimilar metal layer over a surface of the metal conductor portion and an entire surface of the solder resist layer by a physical film formation process, the dissimilar metal layer being formed of at least one metal which is lower in etching rate than copper;

a terminal and wiring formation step, performed after the dissimilar metal layer formation step, of performing copper electroplating to thereby form the external connection terminals on the dissimilar metal layer at positions corresponding to the plurality of openings such that each of the external connection terminals has a diameter greater than that of a corresponding opening, and forming a wiring pattern on the dissimilar metal layer at a position different from positions of the external connection terminals;

a build-up step of alternately laminating the plurality of resin insulation layers and the plurality of conductor layers on the solder resist layer having the external connection terminals and the wiring pattern formed thereon, to thereby form the laminate structure;

a base member removal step, performed after the build-up step, of removing the base member to thereby expose the copper foil; and a terminal exposure step of exposing surfaces of the external connection terminals from the plurality of openings by removing the exposed copper foil and the metal conductor portion through etching.

2. The method of manufacturing a multilayer wiring substrate according to claim 1, wherein the terminal and wiring formation step includes a resist layer formation step of forming on the dissimilar metal layer a plating resist layer having first openings at positions corresponding to the plurality of openings of the solder resist layer, the first openings being greater in area than the plurality of openings, and a second opening corresponding to the wiring pattern, and a copper electroplating step which is performed after the resist layer formation step so as to form the external connection terminals in the first openings, and the wiring pattern in the second opening; and a resist removal step of removing the plating resist layer and a dissimilar metal layer removal step of partially removing the dissimilar metal layer by etching exposed portions of the dissimilar metal layer are performed before the build-up step.

3. The method of manufacturing a multilayer wiring substrate according to claim 1, wherein the dissimilar metal layer is formed of at least one metal selected from the group consisting of gold, nickel, chromium, titanium, cobalt, palladium, tin, and silver.

4. The method of manufacturing a multilayer wiring substrate according to claim 1, wherein the dissimilar metal layer is formed through sputtering.

5. The method of manufacturing a multilayer wiring substrate according to claim 1, wherein in the conductor portion formation step, copper electroplating is performed so as to form the metal conductor portions within the plurality of openings of the solder resist layer.

6. The method of manufacturing a multilayer wiring substrate according to claim 1, wherein the solder resist layer is formed on the first main surface, and the via conductors formed in the plurality of resin insulation layers have a shape such that their diameters increase from the first main surface side toward the second main surface side.

7. A method of manufacturing a multilayer wiring substrate having a laminate structure which has a first main surface and a second main surface and in which a plurality of resin insulation layers made primarily of the same resin insulation material, and a plurality of conductor layers are laminated alternately, wherein a solder resist layer is provided on at least one of the first main surface and the second main surface of the laminate structure, the solder resist layer has a plurality of openings for exposing external connection terminals, and the plurality of conductor layers are connected with one another by via conductors formed in the plurality of resin insulation layers such that their diameters increase toward the first main surface side or the second main surface side, the method comprising:

a solder resist layer formation step of providing a base member having a copper foil separably laminated thereon, and applying a photosensitive resin insulation material on the copper foil to thereby form the solder resist layer;

an opening formation step of forming the plurality of openings in the solder resist layer through exposure and development;

a dissimilar metal layer formation step of forming a dissimilar metal layer over an entire surface of the solder resist layer, including wall surfaces of the plurality of openings and surfaces of the copper foil exposed through the plurality of openings, by a physical film formation process, the dissimilar metal layer being formed of at least one metal which is lower in etching rate than copper;

a terminal and wiring formation step, performed after the dissimilar metal layer formation step, of performing copper electroplating to thereby form the external connection terminals such that the external connection terminals fill interiors of the plurality of openings of the solder resist layer and cover upper ends of the plurality of openings, and forming a wiring pattern on a surface of the solder resist layer at a position different from positions of the external connection terminals;

a build-up step of alternately laminating the plurality of resin insulation layers and the plurality of conductor layers on the solder resist layer having the external connection terminals and the wiring pattern formed thereon, to thereby form the laminate structure;

a base member removal step, performed after the build-up step, of removing the base member to thereby expose the copper foil; and a terminal exposure step of exposing surfaces of the external connection terminals from the plurality of openings by removing the exposed copper foil through etching.

8. The method of manufacturing a multilayer wiring substrate according to claim 7, wherein the terminal and wiring formation step includes a resist layer formation step of forming on the dissimilar metal layer a plating resist layer having first openings at positions corresponding to the plurality of openings of the solder resist layer, the first openings being greater in area than the plurality of openings, and a second opening corresponding to the wiring pattern, and a copper electroplating step which is performed after the resist layer formation step so as to form the external connection terminals in the first openings, and the wiring pattern in the second opening; and a resist removal step of removing the plating resist layer and a dissimilar metal layer removal step of partially removing the dissimilar metal layer by etching exposed portions of the dissimilar metal layer are performed before the build-up step.

9. The method of manufacturing a multilayer wiring substrate according to claim 7, wherein the dissimilar metal layer is formed of at least one metal selected from the group consisting of gold, nickel, chromium, titanium, cobalt, palladium, tin, and silver.

10. The method of manufacturing a multilayer wiring substrate according to claim 7, wherein the dissimilar metal layer is formed through sputtering.

11. The method of manufacturing a multilayer wiring substrate according to claim 7, wherein the solder resist layer is formed on the first main surface, and the via conductors formed in the plurality of resin insulation layers have a shape such that their diameters increase from the first main surface side toward the second main surface side.

* * * * *